United States Patent [19]

Geddes

[11] Patent Number: 4,800,528
[45] Date of Patent: Jan. 24, 1989

[54] NON-VOLATILE MEMORY HAVING CHARGE CORRECTION CIRCUITRY

[75] Inventor: Ronald C. Geddes, Hausen, Switzerland

[73] Assignee: U.S. Philips Corporation, New York, N.Y.

[21] Appl. No.: 129,930

[22] Filed: Dec. 3, 1987

Related U.S. Application Data

[63] Continuation of Ser. No. 21,561, Mar. 2, 1987, abandoned, which is a continuation of Ser. No. 707,354, Mar. 1, 1985, abandoned.

[30] Foreign Application Priority Data

Mar. 1, 1984 [NL] Netherlands .................... 8400661

[51] Int. Cl.$^4$ .................. G11C 7/00; G11C 11/40; G11C 29/00
[52] U.S. Cl. .................. 365/185; 365/210; 357/23.5
[58] Field of Search .............. 365/184, 104, 185, 210, 365/222; 357/23.5

[56] References Cited

U.S. PATENT DOCUMENTS 4,218,764  8/1980  Furuta et al. .................. 365/222
4,371,956  2/1983  Maeda et al. .................. 365/222
4,404,475  9/1983  Drori et al. .................. 365/185

OTHER PUBLICATIONS

Gerber et al., "Low Voltage Single Supply CMOS Electrically Erasable Read Only Memory", IEEE Transactions on Electron Devices, vol. ED-27, No. 7, Jul. 1980, pp. 1211-1216.

Primary Examiner—Stuart N. Hecker
Assistant Examiner—Glenn A. Gossage
Attorney, Agent, or Firm—Steven R. Biren

[57] ABSTRACT

A semiconductor device having one or more first non-volatile memory transistors and a detector having a second non-volatile memory transistor with which a charge level written in the first transistor is safeguarded and corrected, if necessary, by a suitable, incorporated bias voltage between source zone and control electrode and/or a margin fixed by an incorporated difference in threshold voltage. A further non-volatile memory transistor may be present with which there is detected, during writing, erasing or rewritting, whether the desired charge level in the first transistor is reached and the charge transport is to be terminated.

15 Claims, 5 Drawing Sheets

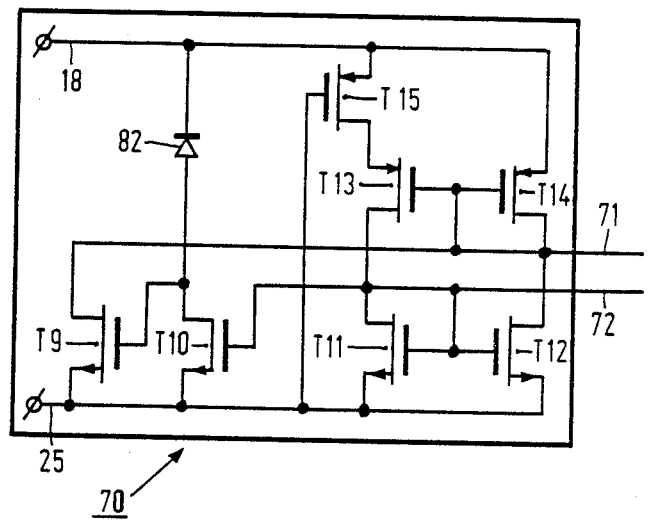
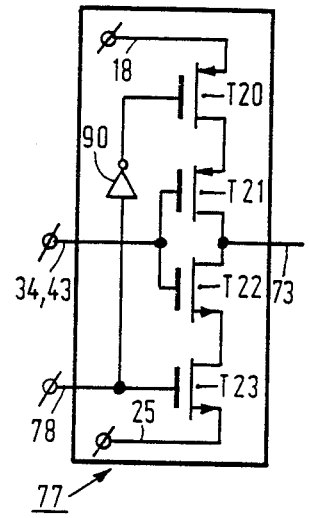
FIG. 10  FIG. 12
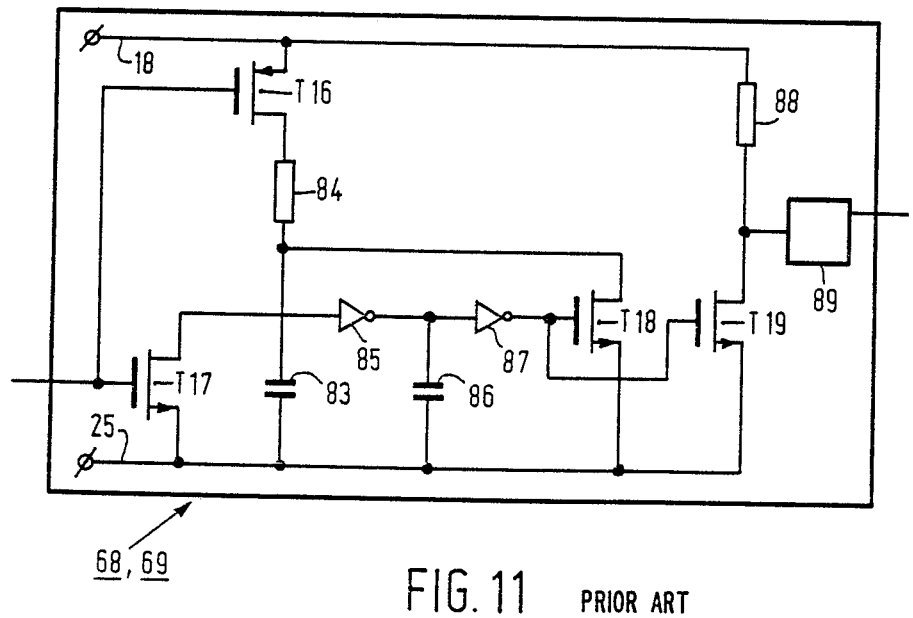
FIG. 11  PRIOR ART

NON-VOLATILE MEMORY HAVING CHARGE CORRECTION CIRCUITRY

This is a continuation of application Ser. No. 021,561, filed Mar. 2, 1987, now abandoned, which was a continuation of Ser. No. 707,354, filed Mar. 1, 1985, now abondoned.

BACKGROUND OF THE INVENTION

The invention relates to a semiconductor device comprising a semiconductor body having a surface at least a non-volatile memory cell which comprises a non-volatile memory transistor, said memory transistor comprising a control electrode coupled capacitively to a charge storage region and source and drain zones of a first conductivity type which are separated from a layer-shaped portion of the semiconductor body adjoining said source and drain zones by a p-n junction, the layer-shaped portion being of a second conductivity type opposite to the first, a channel region of the memory transistor being present between the source and drain zones and being covered with an insulating layer which separates the charge storage region from the channel region, the charge storage region being separated from an injector by a thin insulating layer, charge transport being capable of occuring through said thin insulating layer by applying a suitable electric field to vary the quantity of charge stored in the charge storage region.

Such a memory transistor is known, for example, from IEEE transactions of Electron Devices, Vol ED-27, No 7, July, 1980, pp. 1211-1216. It relates to a p-channel memory transistor in which the charge storage region has the form of a floating conductive layer which is embedded in insulating material. The control electrode is separated from the floating conductive layer by an insulating layer present on the floating conductive layer. The injector has a p-type surface region spaced from the source and drain zones and provided in the layer-shaped portion of the semiconductor body, said p-type injector region and the layer-shaped portion comprising an electrical connection. The p-type injector region laterally adjoins a surface part of the layer-shaped region, which surface part is separated from the floating conductive layer by a thin insulating layer. Charge transport from and to the floating conductive layer may take place through said thin insulating layer. The layer-shaped portion of the semiconductor body may be set up at a reference potential, for example, ground. If the reference voltage is also applied to the control electrode and the injector region is set up at such a high negative voltage that the p-n junction between the injector region and the layer-shaped portion is operated in the avalanche breakdown mode, hot charge carriers are generated in the semiconductor body and hot electrons can reach the floating conductive layer through the thin insulating layer. As a result of this the floating conductive layer is charged negatively. If the injector region is then set up at the reference potential and a suitably large negative voltage is applied to the control electrode, electrons can flow from the floating conductive layer to the semiconductor body through the thin insulating layer by tunneling. As a result of this the floating conductive layer is charged less negatively and can also be charged positively.

The known memory transistor described is one example of the various types of memory transistors which are used in programmable memories usually referred to as EEPROM's or E$^2$PROM's or EAROM's or EPROM's. Such non-volatile memory transistors can generally be erased electrically or by means of U.V.-radiation and then be written (programmed) again electrically.

The charge storage region may be non-conductive intermediate layer embedded in an insulating dielectric layer, for example, as in so-called MNOS-memory transistors. In MNOS-memory transistors the charge representing the information is stored in the proximity of the boundary layer between two different dielectric layers, for example, silicon oxide and silicon nitride. The change of the information content is said memory transistors is usually produced by means of the tunneling of charge carriers between the charge storage region and the underlying channel region of the transistor which serves as the injector.

In other memory transistors the charge storage region hence has the shape of a floating conductive layer. In this case, instead of injection of hot carriers generated by means of avalanche breakdown for charging and discharging or injecting hot carriers in one direction and tunneling charge carriers to the semiconductor body in the other direction, the tunneling of charge carriers in both directions may also be used for writing and erasing. In memory transistors in which the charge transport in both directions is based on a tunneling mechanism, the injector is often formed by a part of the drain zone of the transistor, which part is separated from the floating conductive layer by a very thin insulating layer having a thickness of, for example, a few tens of Angströms.

The control electrode is usually provided on an insulating layer above the floating conductive layer. However, the control electrode may be also present entirely or partly is the semiconductor body. Although the injector is usually present in the semiconductor body in the form of a doped zone, the injector may also be present in the form of a conductive layer above the floating conductive layer. Furthermore, the last-mentioned conductive layer may also be used in combination with an injector present in the semiconductor body, one injector serving of the supply of charge carriers to the charge storage region and the other injector serving for the drain of charge carriers from the charge storage region.

All the memory transistors indicated hereinbefore have in common that information in the form of charge is stored in the charge storage region, in which on the one hand it must be possible to vary the charge state sufficiently rapidly with voltage and currents which are as low as possible and on the other hand to preserve the charge sufficiently long once it has been stored. For this retaining of stored charge it is notably necessary that in the charged condition of the charge storage region no undesired transport of charge carriers takes place which can discharge the charge storage region. In this charged condition charge is present in the càpacities of which the charge storage region forms a part, for example, the coupling capacity between the charge storage region and the control electrode and the coupling capacity between the charge storage region and the injector. A voltage which may result in the leaking away of stored charge is then present across said capacity. Moreover, applying voltages to the connections of the memory transistor may also stimulate undesired charge transport from or to the charge storage region.

It will be apparent that as the writing and erasing of the memory transistors can more easily be carried out, that is to say, the writing and erasing take place with smaller currents and preferably at lower voltages, the realization of the desired long retaining time can easily lead to a comparatively low yield of manufacture of the semiconductor device in question.

The leaking away of charge can furthermore be stimulated by particular circumstances, for example, an operating temperature which, whether or not temporarily, is higher than was anticipated. The reliable operation of the semiconductor device can be endangered by these and other causes.

SUMMARY OF THE INVENTION

One of the objects of the present invention is to further improve the reliability of semiconductor devices of the kind described above and to reduce the possibility of the undesired loss of stored information.

A semiconductor device of the kind described above is characterized according to the invention in that the semiconductor body comprises a detector which has a second non-volatile memory transistor, the output signal of which, with a previously-determined quantity of charge stored in the charge storage region of the said one, the first, memory transistor, forms a reference value, means being present to read the output signal of the second memory transistor and to correct the quantity of stored charge in both memory transistors when it is established that the reference value is exceeded.

The reliability of the semiconductor device is considerably improved by signalling undesired variation of the charge content of the non-volatile memory transistor by means of a detector having an at least substantially similar transistor integrated in the semiconductor device as a sensor element. Inter alia the recognition is of importance that in substantially all applications of semiconductor devices with non-volatile memories the time that the supply of the device has dropped out by switching off or by interference is many times smaller than the retaining time of the non-volatile memory transistor prescribed according to the specification of the semiconductor device in question. This means that with the indicated way of keeping watch and correction, the period of time that no safeguarding can be obtained is also comparatively small, while on the other hand it is ensured by using the invention that, at the instant the supply drops out, the written information content is present with a safe margin to be chosen by means of the reference value.

Furthermore, with regard to the importance of the present invention it is to be noted that the retention time of the memory transistors which nowadays according to specification usually is more than 10 years at a temperature of the semiconductor body of 125° C., may be considerably smaller at high temperatures. Dependent on the use of the semiconductor device, such higher temperatures may, expectedly or unexpectedly, occur for longer or shorter times. During operation of the semiconductor device electric voltages may, intentionally or unintentionally, appear at the memory transistors which may cause undesired charge transport. The present invention results in the extra safety that in such circumstances written information is not undesirably lost.

The present invention may be used for a number of applications, for example, to admit during reading the memory transistor and/or in half-selected memory transistors, larger voltages and hence to keep the design of the device comparatively simple.

The application of the present invention may also be used to permit a larger spreading in the retention time of the memory transistor, as a result of which a higher yield in the manufacture of the semiconductor device can be obtained.

Furthermore, the present invention provides the possibility, dependent on the application, to use memory transistors having a retention time smaller than the usual retention time. This possibility is inter alia of importance for the use of non-volatile memory transistors in semiconductor devices which are manufactured by means of an existing manufacturing process which is not optimized for realizing non-volatile memory transistors. In this manner the co-integration of one or more non-volatile memory transistors in, for example, microprocessors or integrated circuits for clockworks, may become simpler. Already existing integrated circuits can now be improved more easily by the addition of non-volatile memory transistors, namely without this requiring a quite new design of the whole integrated circuit in a new and optimized manufacturing process.

The one, or first, memory transistor and the second memory transistor preferably have a common charge storage region. The common charge storage region enables a direct safeguarding of the charge quantity which represents the information.

In a further preferred embodiment of the semiconductor device according to the invention the second memory transistor has a control electrode which is connected to that of the first memory transistor.

An important preferred embodiment of the semiconductor device in accordance with the invention is furthermore characterized in that a plurality of memory cells are present each having a second memory transistor. In this embodiment the information content of each memory cell is a safeguard separately as a result of which a very great reliability can be obtained.

The first and second memory transistor are preferably constructed with threshold voltages differing from each other. During manufacture the threshold voltages can often be adjusted without many problems at desired values and the difference in threshold voltages then provides, in a comparatively simple manner, an incorporated value, an incorporated safety margin for the written information, the information being rewritten when said margin is exceeded.

According to a further important aspect of the invention a further, non-volatile memory transistor is formed, an output signal of which indicates that a fixed charge level in said charge storage region is reached by charge transport between the injector and the charge storage region of the first non-volatile transistor, means being present to terminate the said charge transport by means of said output signal. According to this aspect of the invention it is signalled upon writing or erasing or re-writing that the charge level which represents the written information has been reached. As a result of this the producibility of written charge levels is increased. Said greater reproducibility of charge levels to be written may also be of advantage in semiconductor devices having non-volatile memory cells in which no safeguarding and correction of charge levels when once written by means of a second non-volatile memory transistor is incorporated.

BRIEF DESCRIPTION OF THE DRAWING

The invention will be described in greater detail with reference to several embodiments and the accompanying diagrammatic drawing, in which:

FIGS. 10, 11 and 12 show a control circuit, an oscillator circuit and an input circuit, respectively, which may be used in the second embodiment.

DESCRIPTION OF THE PREFERRED EMBODIMENTS

Figure 1:
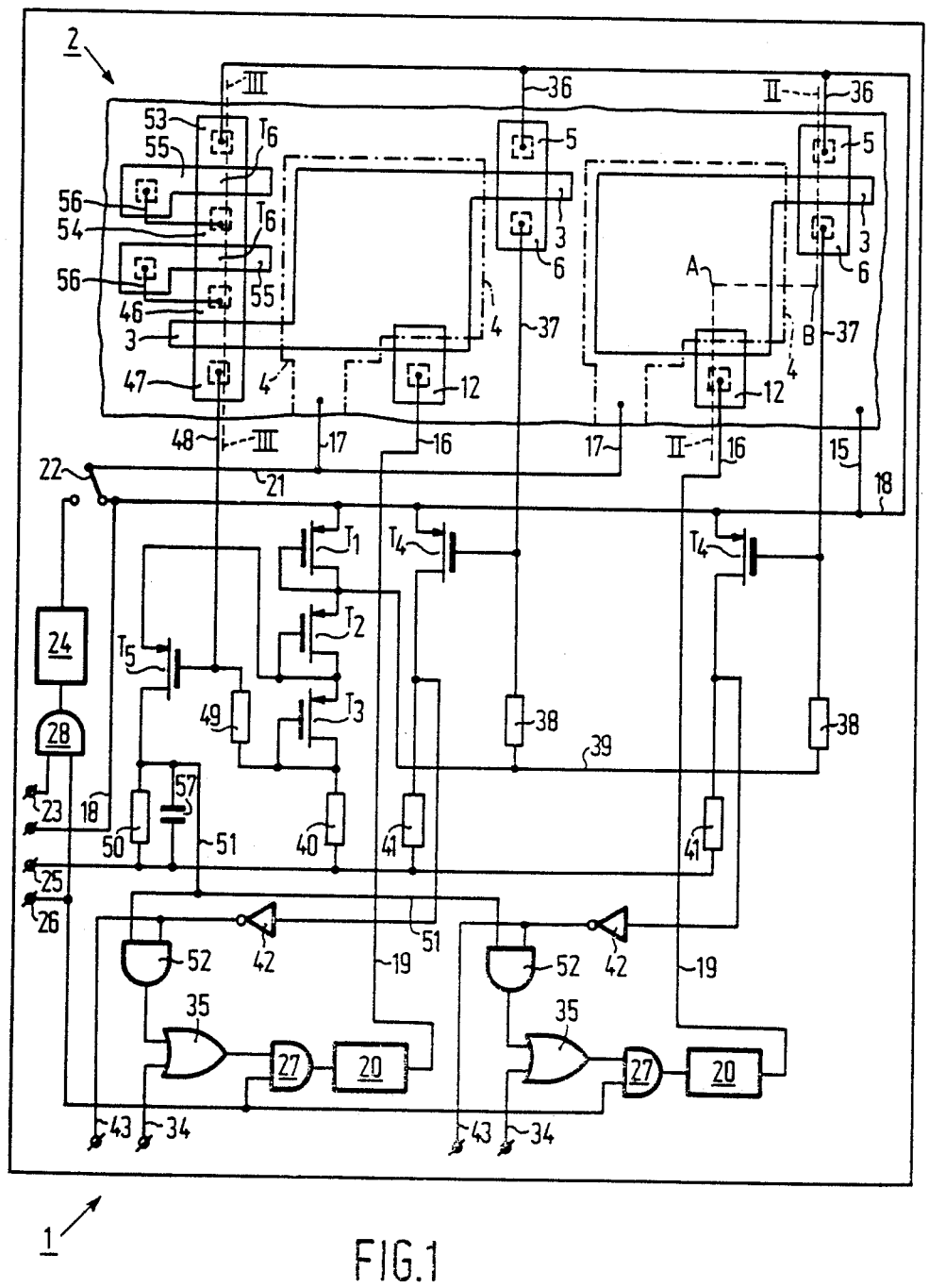
FIG. 1 shows a first example, a first preferred embodiment, of the semiconductor device according to the invention, a part of the semiconductor body being shown as a diagrammatic plan view.

The first example relates to a semiconductor device which is shown diagrammatically by the block 1 in FIG. 1. This device has a semiconductor body 2 of which inside the block 1 a part is shown (diagrammatically and not completely) in plan view. In the practical construction the whole device 1 is integrated in the semiconductor body 2, whether or not together with further circuit elements.

Figure 2:
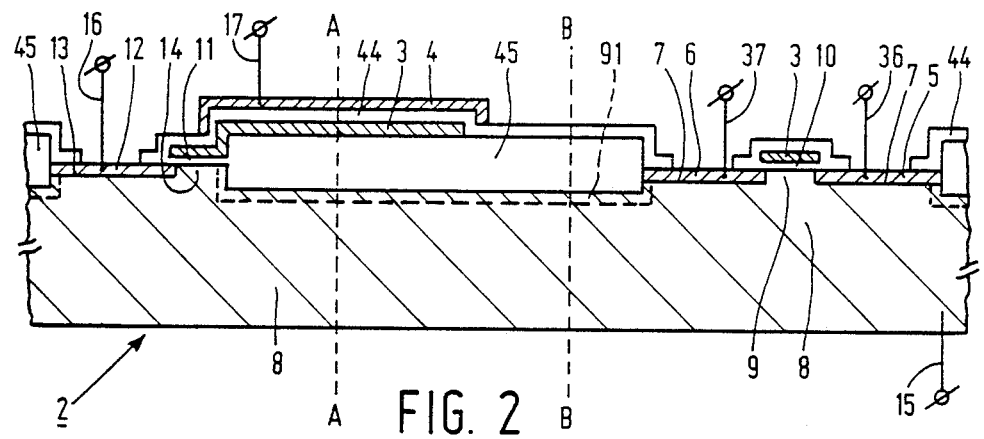
FIG. 2 is a diagrammatic cross-sectional view of the semiconductor body of this example taken on the line II—II of FIG. 1, the points A and B of FIG. 1 corresponding to the broken lines A—A and B—B, respectively, of FIG. 2.

The semiconductor body 2 comprises at least a non-volatile memory cell which comprises a non-volatile memory transistor. FIG. 1 shows two non-volatile memory transistors each having a control electrode 4 coupled capacitively to a charge storage region 3 and source and drain zones 5 and 6, respectively, of a first conductivity type (see also FIG. 2). The zones 5 and 6 are, for example, p-type zones and they are separated from a layer-shaped portion or surface-adjoining layer 8 of the semiconductor body 2 adjoining the source and drain zones 5 and 6 by means of a p-n junction 7. The layer-shaped portion 8 is of the second conductivity type opposite to the first. In the example the layer-shaped portion 8 is formed by an n-type substrate which is common for the semiconductor device. However, the layer-shaped portion 8 may alternatively be formed by a surface part of a semiconductor body which is substantially p-type, said surface part being made n-type by overdoping. Such a structure may occur, for example, if CMOS-technique has been used in the integrated circuit.

A channel region 9 of the memory transistor is present between the source and drain zones 5 and 6 and is covered with an insulating layer 10 which separates the charge storage region 3 from the channel region 9.

The charge storage region 3 is separated from an injector by a thin insulating layer 11. Said injector has a p-type region 12 which is provided in the layer-shaped portion 8 and is separated therefrom by a p-n junction 13. The p-type injector region 12 laterally adjoins a surface part 14 of the layer-shaped region 8, which surface part 14 is separated from the charge storage region 3 by the thin insulating layer 11.

Figure 4:
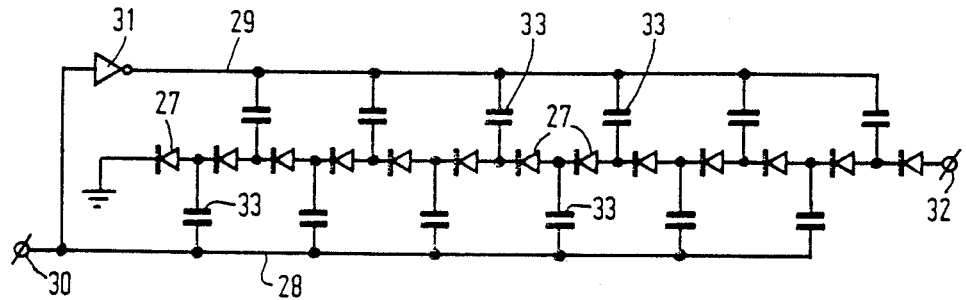
FIG. 4 shows a circuit diagram of a voltage multiplier.
Figure 5:
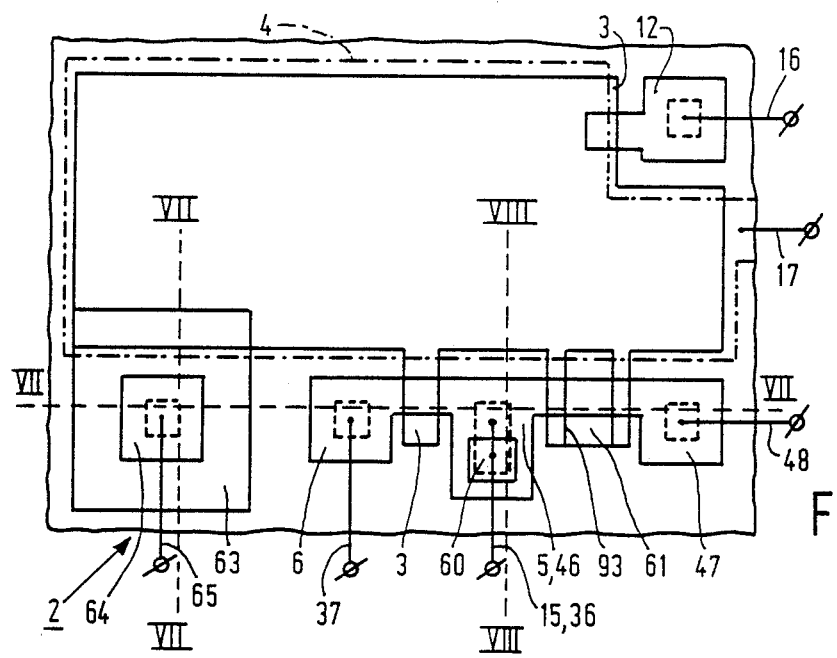
FIG. 5 is a diagrammatic plan view of a part of the semiconductor body of a second preferred embodiment of the semiconductor device in accordance with the invention.
Figure 6:
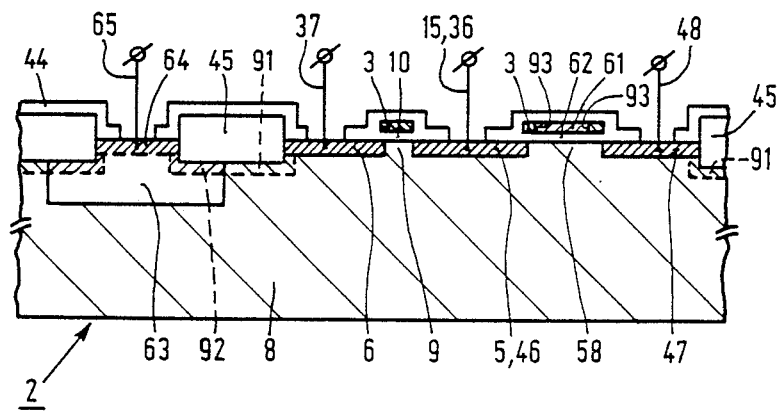
FIGS. 6, 7 and 8 are diagrammatic associated cross-sectional views taken on the lines VI—VI, VII—VII, and VIII—VIII, respectively, of FIG. 5.
Figure 7:
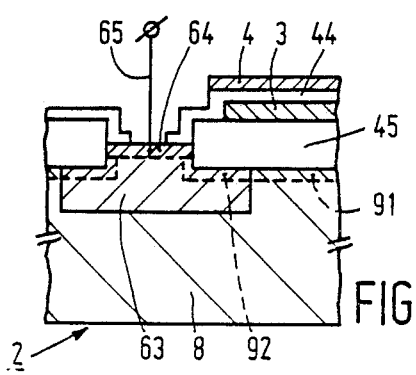
Figure 8:
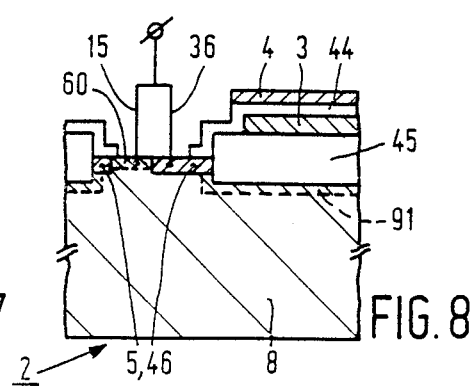

The layer-shaped portion 8 has an electrical connection 15 which is shown diagrammatically. The p-type injector region 12 has a connection 16 shown diagrammatically and the control electrode 4 has a connection 17 shown diagrammatically. The connection 15 is connected to a point of reference potential, for example ground, which is indicated by the line 18. The connections 16 are each connected by a connection 19 to a charge pump or voltage multiplier 20. The connections 17 are connected, via a common connection 21, to a diagrammatically shown switch 22. Said switch 22 is controlled by an erase signal which is presented to the connection 23. Said control of the switch 22 is not shown in FIG. 1. Dependent on the signal which is present at 23, the connection 21 is connected to the line 18 via the switch 22 or the charge pump or voltage multiplier 24. A supply voltage of, for example, approximately −5 Volts may be applied to the connection 25. A suitable oscillator may be connected to the connection 26 which, if desired, may also be integrated in the semiconductor body 2. The oscillator signal is supplied to the AND-gates 27 and 28 the outputs of which are connected to the respective voltage multipliers 20 and 24. In the example the voltage multipliers 20 may provide a voltage of approximately −35 Volts, while the voltage multiplier 24 can generate, for example, a voltage of approximately −75 Volts. Dependent on the signal which is presented to the other input of the AND-gates 27 and 28 not connected to the oscillator, the output signal of said gates is low or a pulsatory signal is applied to the voltage multipliers 20 and 24 with which the desired high voltages are generated. The voltage multipliers 20 and 24 may be of any usual type. For example, they may comprise a series arrangement of diodes 27 (FIG. 4) in which the nodes between said diodes are alternately coupled capacitively to two lines 28 and 29, respectively, which are driven in opposite phases. They have, for example, an input 30 to which a pulsatory signal is applied with which the line 28 is driven. An inverter 31 ensures that the line 29 is driven in opposite phase. The high voltage is derived at the output 32 which is formed by one end of the series arrangement. The other end of the series arrangement of diodes may be applied to a reference voltage, for example ground. The value of said high voltage depends upon the number of stages which the multiplier comprises. The capacities 33 may have a value, for example, of approximately 0.1 pF.

The voltages generated by the voltage multipliers are used for writing and erasing. The non-volatile memory transistors, in the condition in which the charge storage region formed by the floating conductive layer or floating electrode 3 is uncharged, have a threshold voltage (to be applied to the control electrode 4), for example, of approximately −0.5 Volts. If the line 21 is connected to the line 18 via the switch 22 the memory transistors in said charge condition are non-conductive. This condition, or in general a charge condition in which the threshold voltage is negative, may represent, for example, the logic zero. Writing is now performed by presenting a logic one in the form of a high signal of approximately 0 Volts to the relevant input 34. This signal is transmitted by the OR-gate 35 to the AND-gate 27 so that the voltage multiplier 20 generates a voltage of approximately −35 Volts which is supplied to the p-type injector region 12. As a result, avalanche breakdown of the p-n junction occurs, hot charge carriers being generated in the proximity of said junction. Hot electrons which are present in the surface part 14 can reach the floating electrode 3 through the thin insulating layer 11, as a result of which said floating electrode is charged negatively. As a result of this the threshold voltage of the memory transistors shifts to a positive value so that said transistors, with a voltage of 0 Volts on the control electrode 4, are conductive in said charge condition. Said charge condition in which the floating electrode 3 is charged negatively represents the logic one. After writing, the signal at the input 34 in question returns to a low value of, for example, approximately −5 Volts. An uninterrupted voltage of approximately −5 Volts then appears at the input of the voltage amplifier 20 and the charge stored in the small capacities 33 will leak away rather rapidly and the output of the multiplier will return to a voltage of approximately 0 Volt.

A voltage of approximately 0 Volt is presented at 23 for erasing. The switch 22 connects the line 21 to the voltage multiplier 24. As a result of this, a voltage of approximately −75 Volts is presented to all control electrodes 4 simultaneously. As a result of the large coupling capacity between the control electrode 4 and the floating electrode 3, the potential of the floating electrode 3 also becomes negative and electrons can tunnel from the floating electrode 3 through the thin insulating layer 11 to the layer-shaped portion 8 and/or the injector region 12. As a result of this the floating electrodes 3 are discharged and the threshold voltage of the memory transistors shifts to a negative value. After erasing has been completed a voltage of approximately −5 Volts is presented at 23 and the switch 22 again connects the line 21 to the line 18. The memory transistors have returned to the non-conductive state.

In order to obtain a sufficiently large coupling capacity between the control electrode 4 and the floating conductive layer 3, the floating conductive layer 3 is present on the thick field oxide 45 for a comparatively large part. This part of the floating conductive layer 3 is situated opposite to control electrode 4, the conductive layer 3 and the control electrode 4 being separated from each other by the thin insulating layer 44.

For reading the charge condition of the floating electrode 3, the source zones 5 of the memory transistors are provided with a diagrammatically shown connection 36 which connects said zones to line 18. The drain zones 6 have a diagrammatically shown connection 37 which connects said zones 6 each via a resistor 38 to the line 39. The line 39 conveys a voltage of approximately −0.5 Volt which is derived from the supply voltage by means of the transistors $T_1$, $T_2$ and $T_3$ connected as a diode and the resistor 40. The line 39 is connected to the node between the diodes $T_1$ and $T_2$. The voltage swing at the drain zones 6 is hence restricted to the threshold voltage of transistor $T_1$. By keeping the voltages applied to the memory transistor during reading close to 0 Volt, the potential difference occuring across the insulating layers adjoining the floating electrode 3 are kept as small as possible. Notably the thin insulating layers 10 and 11 and the insulating layer 44 which separates the control electrode 4 from the floating electrode 3 may be of importance in this connection. The use of potential differences which are as small as possible means that undesired charge transport from or to the floating electrode 3 which might be caused by applied voltages is minimized.

The transistor $T_4$ is driven by the signal of the connection 37. Said transistor $T_4$ is connected in series with a resistor 41 between the line 18 (0 Volt) and the supply lines 25 (−5 Volts). The signal at the drain of transistor $T_4$ will thus be substantially 0 Volt or substantially −5 Volts. This signal is transmitted to the signal output 43 via the inverter 42.

Figure 3:
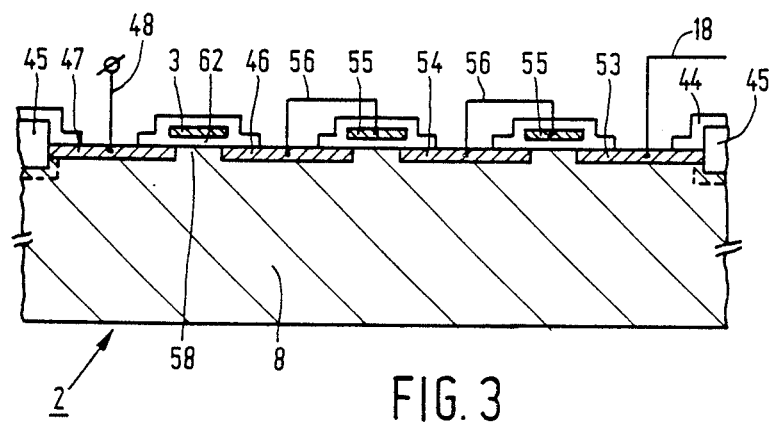
FIG. 3 is a diagrammatic cross-sectional view of the semiconductor body of the first example taken on the line III—III of FIG. 1.

According to the invention the semiconductor body 2 of the semiconductor device 1 comprises a detector which has a second non-volatile memory transtor. FIG. 1 shows, in addition to the two first memory transistors already described, a second memory transistor having source and drain zones 46 and 47, respectively, a floating conductive layer 3 and a control electrode 4 (see also FIG. 3). The floating conductive layer 3 is separated from the channel region 58 of the second memory transistor by a thin second insulating layer 62. Said second memory transistor serves as a sensor and is preferably equal to the first memory transistors as much as possible.

Via the diagrammatically shown connection 48 a signal can be derived from the drain zone 47 which in a manner similar to that of the signals of the first memory transistors, can be read by means of a resistor 49, a transistor $T_5$ and a resistor 50. The signal thus obtained is applied to means which in this example comprise inter alia the connection 51, the AND-gates 52 and the OR-gates 35 and by means of which that quantity of stored charge in the first and second memory transistors is corrected, if necessary.

The signal obtained at the drain of the transistor $T_5$ is compared by means of the AND-gates 52 with the signals occurring at the drains of the transistors $T_4$, the last-mentioned signals being first inverted by the inverters 42. If both inputs of one or more AND-gates 52 are high (0 Volt), a high signal will be transmitted to the relevant OR-gates 35 and the relevant first memory transitor will be written again. Negative charge will be applied to the relevant floating electrode 3. The capacity 57 connected in parallel with the resistor 50 ensures that the inputs of an AND-gate 52 remain high for a sufficiently long period of time to be able to supply sufficient charge to the floating electrode 3 so as to restore the original charge condition which is associated with a written logic one.

In order to obtain the operation aimed at, namely the timely rewriting of programmed logic ones, a reference value is desired. In the present example such as reference value is obtained by connecting the source zone 46 of the second memory transistor to the line 18, not directly but via the series arrangement of two transistors $T_6$ connected as a diode. Said series connection is realized with three p-type surface zones 53, 54 and 46 and two gate electrodes 55 which are connected to the source zoned 54 and 46, respectively, of the relevant transistor $T_6$ via a diagrammatically shown connection 56.

The transistors $T_6$ each have a threshold voltage of approximately −0.5 Volt so that the potential at the source zone 46 of the second memory transistor will be approximately −1 Volt. The potential of the drain zone 47 is adapted by connecting the resistor 49 not to the line 39 but to the node between the transistor $T_3$ and the resistor 40. The potential of the source zone of transistor $T_5$ is adapted by connecting it not to the line 18, but to the injection point between the transistors $T_2$ and $T_3$.

In comparison with the first memory transistors in which during reading substantially no voltage difference is present between the gate electrode 4 and the source zone 5, the control electrode 4 in the second memory transistor has a bias voltage of +1 Volt with respect to the source zone 46. This means that if the quantity of charge stored on the floating conductive layer 3 decreases, the second memory transistor will already pass from the conductive state into the non-conductive state when the first memory transistor still remains conductive. As a result of said change-over the logic one is rewritten in the manner already described.

The quantity of charge which is still stored in the charge storage region of the first memory transistor at the instant the second memory transistor provides the signal for rewriting, is determined by the bias voltage which is applied to the second memory transistor. Said bias voltage is substantially fixed by the two co-integrated transistors $T_6$ connected as a diode.

The invention provides a safeguarding of the programmed logic ones with a safety margin which is fixed by means of an incorporated bias voltage. The value of the safety margin can be given a suitable value dependent on the use and the desired reliability in which said margin will at any rate be so large that sufficient charge always remains stored to be able to retain the written information in a period of time in which the supply has dropped out by switching off or by inteference. The choice of a suitable margin can thus depend on the one hand on the retention time of the memory transistors and on the other hand on the use and the expected length of supply-less periods.

The second memory transistor or sensor may be a separate transistor separated from the first memory transistor or transistors and having a structure and construction which is equal to that of the first memory transistor(s) or at least is comparable thereto. If in this sensor the charge level to be safeguarded, in this example corresponding to the logic one is written, the output signal may be used directly to rewrite all first memory transistors in which the same logic information had been written.

The second memory transistor and the first or one of the first memory transistors preferably have a common charge storage region 3 as in the embodiment described. This has for its advantage that the quantity of charge stored in the relevant first memory transistor is already safeguarded directly. The charge storage region 3 then preferably has the form of a common conductive layer which is coupled both to the channel region 9 of the first memory transistor and to the channel region 58 of the second memory transistor. This common electrically floating conductive layer is usually surrounded entirely by insulating material.

The first and the second memory transistors may comprise control electrodes 4 which are separated from each other. In that case the reference values and the safety margin can be obtained by applying a suitably chosen potential to the control electrode of the second transistor during the reading thereof other than the potential to by applied to the control electrode of the first memory transistor during reading. The second memory transistor preferably has a control electrode 4 which is connected to that of the first memory transistor, as in the example described. In the example the control electrode 4 is common to the second memory transistor and one of the first memory transistors.

The use of first and second memory transistors which have their charge storage region, their control electrode and their injector in common is advantageous when all first memory transistors of the semiconductor device are combined in this manner with a second memory transistor. Such semiconductor devices have the advantage that the information content, the charge stored in the charge storage region of each first memory transistor is supervised. The reliability of the semiconductor device thus is very great. This construction is particularly suitable for semiconductor devices having a restricted number of first memory transistors which, for example, does not exceed 100. If the number of information bits which it must be possible to store in the memory of the semiconductor device is larger, one detector for the whole memory or, for example, one detector per memory word will suffice. For example, in the embodiment described the first memory transistor which is combined with a second memory transistor and is shown in the left-hand upper half of FIG. 1 may serve for safeguarding the information content of several, for example 8 or 9, first memory transistors which are constructed as shown in the right-hand upper half FIG. 1. The reliability is less great because safeguarding in no longer performed on the information bits themselves written in the memory cells but on a control bit which is stored in a separate charge storage region. If the retention times of the various charge storage regions of the semiconductor device differ little from each other, only a few problems will occur. If is also possible to choose the safety margin which is used in safeguarding to be larger so as to increase the reliability, if necessary. An advantage of devices of this kind is that for realizing the safeguarding less surface area of the semiconductor body is necessary. As is known this has a favorable influence on the yield of the semiconductor device in question.

Larger memories can be obtained by arranging memory cells in rows and columns in otherwise known manner. If necessary, the memory cells may comprise one or two selection transistors in addition to a first memory transistor. Such memories with non-volatile memory transistors realized in a matrix form are generally known. If in such memories each cell has a detector according to the invention or if a number of memory cells have a detector in common, the safeguarding may be carried out permanently as long as the supply voltage is present, or the information content may only be controlled (and corrected, if necessary) each time when the memory cell or group of memory cells in question is selected. Permanent safeguarding is to be preferred due to the greater reliability and because the organization of the memory is then usually simpler. If control is performed only in the selected condition, it will often be necessary for the memory to be organized so that all memory cells are selected sufficiently often to be able to realize a reliable safeguarding. If the memory is constructed with a common detector or with a restricted number of detectors, the rewrite signal generated by a detector may be used as an indication for reading the information content of the relevant group of memory cells and to subsequently rewrite said read information again in said memory cells. In semiconductor devices which comprise a microprocessor such a read and rewrite operation can simply be controlled by the microprocessor. The said rewrite signal may serve, for example, as an interrupt signal for the microprocessor.

In the example described hereinbefore the voltage difference between the source zones 5 and 46, respectively, the drain zones 6 and 47, respectively, of the first and the second memory transistors is always limited to values smaller than or equal to a threshold voltage. The largest voltage difference occurs when the memory transistor in question is non-conductive. If it is not necessary for said voltage difference to be limited to a comparatively low value, the circuit described can be simplified. The transistors $T_1$, $T_2$ and $T_3$, the resistor 40 and the connection 39 may then be omitted. The resistors 38 and 49 are now connected to the supply line 25. The series arrangements of p-channel transistor $T_4$ with resistor 41 and of p-channel transistor $T_5$ with resistor 50 are both replaced by a series arrangement of a resistor and an n-channel transistor in which the source zone of the said transistors are connected to the supply line 25. The gate electrodes of said n-channel transistors are directly connected to the respectively drain zones 6 and 47. The crossings between the resistors and the n-channel transistors are connected to the inverter 42 and to the connection 51, respectively. The capacity 57 between the connection 51 and the supply line 25 remains present.

The second example relates to a semiconductor device which comprises a first and a second non-volatile memory transistor which are shown diagrammatically and not completely in FIGS. 5 to 8. Said memory transistors correspond to a considerable extent to the memory transistors described in the first example. Corresponding parts are referred to by the same reference numerals. In so far as said corresponding parts are not mentioned hereinafter, reference is made to the description of the first example for the explanation of the reference numerals in question.

The first and the second memory transistor in the second example not only have a charge storage region in the form of a floating conductive layer or electrode 3, a control electrode 4 and an injector 12, 16 in common, but also a source zone 5, 46. Furthermore, an n-type zone 60 which has a higher doping concentration than the n-type layer-shaped region 8 is provided in a recess of said common p-type source zone 5, 46. The source zone 5, 46 and the layer shaped region 8 have a common electric connection 15, 36. The said n-type zone 60 is not necessary. The connection 15 may also be provided at another suitable location.

Both in the first and second example the floating conductive layers 3 may be, for example, of polycrystalline or amorphous silicon. Said conductive layers 3, for example, are doped p-type entirely or substantially entirely. In the present example a part 61 of the floating electrode 3 which is present above the channel region 58 of the second non-volatile memory transistor, however, is n-type doped. As a result of this difference in doping the first memory transistor, as in the first example, has a threshold voltage of approximately −0.5 Volt, while the second memory transistor has a threshold voltage of approximately −1.5 Volts due to use of the n-type part 61. This incorporated difference in threshold of approximately 1 Volt in this example determines the safety margin which is observed in safeguarding in view of the stored charge. An electric bias voltage as generated in the first example by the diodes $D_6$ is superfluous in this case. One of the advantages of this is that comparatively small potential differences can be used now also in the second memory transistor during reading. Also, area is saved as the semiconductor surface both due to the use of a common source zone 5, 46 and as a result of the absence of diodes $T_6$.

It is to be noted that the incorporated threshold difference can also be obtained in a different manner. For example the p-type doping concentration in the channel region 58 of the second memory transistor can be slightly increased by implantation. The thickness of the first and second insulating layers 10 and 62 may also be chosen to be different from each other and/or materials differing from each other may be used for said layers. In general, any known method of adjusting desired threshold voltages of insulated gate field-effect transistors as well a combination of such methods may be used to obtain a suitable difference in threshold voltage. If necessary, a difference in threshold voltage may be combined with a suitably-chosen different in electric bias voltage so as to realize the desired safety margin or the desired reference level.

Furthermore, a deep p-type drain zone 63 is provided in the semiconductor body 2 and extends down to below the field oxide 45 and at that area down to below the floating conductive layer 3. A more highly-doped surface zone 64 is provided in a surface part of said drain zone 63 simultaneously with the provision of the source and drain zones 63 simultaneously with the provision of the source and drain zones 5, 46, 6 and 47. The drain zones 63, 64 has a diagrammatically shown electrical connection 65.

The drain zone 63, 64 together with the source zone 5, 46 and the floating conductive layer 3 constitutes an insultated gate field-effect transistor, the threshold voltage of which is also determined by the part of the field oxide 45 which serves as a gate dielectric for said transistors. The threshold voltage is, for example, approximately −12 Volts. As will be explained hereinafter, said further transistor with large threshold voltage serves as a sensor for detecting the completion of the writing process and the writing process can be terminated by means of the signal generated by said sensor.

For the operation aimed at, it is of importance for the drain zone 63, 64 to extend down to below the floating conductive layer 3 and for the threshold voltage for current conduction between the common source zone 5, 46 and said drain zones 63, 64 to be determined at least also by the field oxide 45. This means inter alia that said drain zone might be constructed just as the injector region 12. The construction of the drain zone 63, 64 chosen in the present example, however, has the advantage that the surface part of the floating conductive layer which is separated from the underlying semiconductor body by a comparatively thin insulating layer (the layers 10, 11 and 62) need not be enlarged. Moreover, the drain zone 63, 64 described can be obtained in a standard CMOS manufacturing process without this requiring extra treatments.

Figure 9:
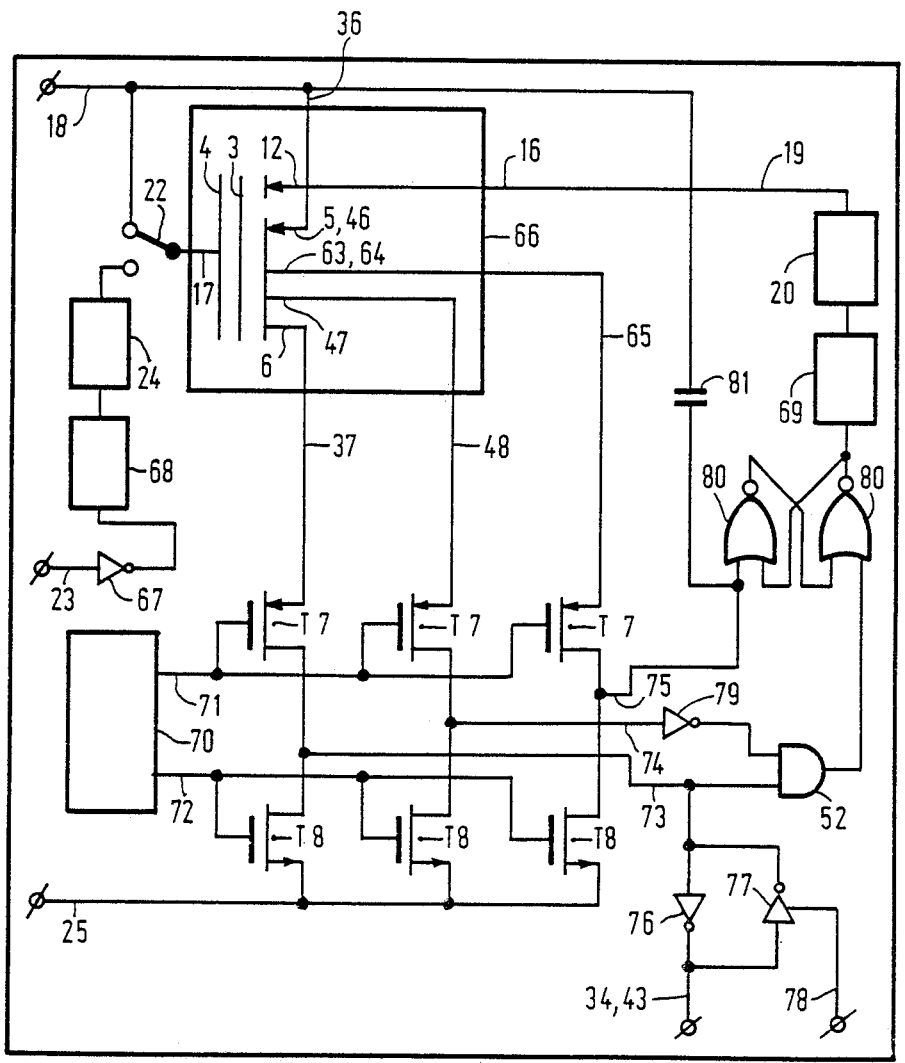
FIG. 9 is a diagram associated with the second preferred embodiment.

The combination of non-volatile memory transistors described with reference to FIGS. 5 to 8 forms part of a semiconductor device 1 in which further circuit elements and/or circuits are also integrated. FIG. 9 shows diagrammatically the combination of non-volatile memory transistors described by the symbol shown inside the block 66. The semiconductor device 1 may further comprise inter alia the components shown in FIG. 9.

As shown in FIG. 9, the erase signal (connection 23), with which the switch 22 is controlled, is applied to an oscillator 68 via an inverter 67. Said oscillator 68 drives the voltage multiplier 24. In a corresponding manner an oscillator 69 is incorporated for writing and is connected to the voltage multiplier 20. The oscillator signal input 26 shown in FIG. 1 is not necessary in the FIG. 9 configuration.

For reading the signals to be generated by the memory transistor combination the connections 37, 48 and 65 are each connected to the supply connection 25 via the series arrangement of a p-channel transistor $T_7$ and a n-channel transistor $T_8$. The gate electrodes of said transistors $T_7$ and $T_8$ are driven in the manner shown from a circuit having two outputs 71 and 72, respectively, indicated by the block 70. Said circuit 70 ensures that the voltage at the output 71 is approximately a transistor threshold voltage (0.5 Volt) lower than the reference potential of connection 18. The voltage at the output 72 is approximately a threshold voltage more positive than the voltage of connection 25. By means of the use of said voltages it is achieved that the potential difference which occur during reading in the memory transistor combination are restricted to very small values, in which the transistors $T_7$ and $T_8$ can always conduct current so long as the supply voltage is present. The voltages at the connections 37, 48 and 65 are substantially equal to the voltage at the connection 18. The voltage swing available as a signal at each of the nodes between a transistor $T_7$ and a transistor $T_8$ is substantially equal to the supply voltage difference between the connections 18 and 25.

If the common charge storage region 3 does not comprise any charge and the first memory transistor thus comprises a logic zero as information, no current will flow through any of the three drain zone connections 37, 48 and 65. The three output lines 73, 74 and 75 then carry a low voltage ($-5$ Volts). The information output signal, the read-out signal of the first memory transistor, is transmitted to the data output 43 via the output line 73 and an inverter 76. Said data output also serves as a data input 34. For that purpose, the inverter 76 is shunted by an input circuit 77 which transmits, after inversion, the data signal present at the connection 34, 43 to the line 73 only if a write signal is present at the connection 78. The signal levels of the data signals at the connection 34, 43 are reversed with respect to the levels at the connections 34 and 43 of the first example.

The output line 73 is further connected to an input of the AND-gate 52. The reading or detector signal of the second memory transistor is presented to another input of the AND-gate 52 via the output line 74 and the inverter 79. So long as the second memory transistor is non-conductive the last-mentioned input of the AND-gate 52 thus has a high voltage (0 Volt).

When the line 73 is brought to the high voltage level via the data input 34, 43, the AND-gate 52 gives a high output signal (0 Volt). Said output signal controls one of the inputs of a flip-flop formed, for example, from two cross-coupled NOR-gates 80. The output of the flip-flop connected to the oscillator 69 now is low ($-5$ Volt), so that the writing process begins. The oscillator 69 and the voltage multiplier 20 ensure that a high voltage of approximately $-35$ Volts is applied to the injector region 12. During the writing process the first and the second memory transistor change into the conductive state rather rapidly. As soon as the second memory transistor is conductive, one of the inputs of the AND-gate 52 becomes low, so that the input of the flip-flop connected to said gate becomes low. As a result of this, however, the flip-flop does not change from one stable state into the other. The writing process is not interrupted.

The writing process is continued until so much charge has been stored in the charge storage region 3 that the third, the further memory transistor, also becomes conductive. Current then flows through the connection 65 and the output line 75 which is connected to the second control input of the flip-flop conveys a high voltage (0 Volt). The flip-flop flips over the other stable state and the oscillator 69 recieves a high signal (0 Volt) so that the writing process is terminated.

After the high negative voltage at the injector region has dropped out, the further transistor with the drain zone 63, 64 is non-conductive. The floating electrode 3 no longer induces a conductive inversion channel below the field oxide 45. Said transition to the non-conductive state is a result of the capacitive coupling between the floating electrode 3 and the injector region 12. Although said coupling is small and at any rate is much smaller than the capactive coupling between the floating electrode 3 and the control electrode 4, the potential of the floating electrode 3 during writing will be more negative than after termination of the writing process as a result of the high negetive voltage at the injector region 12. The potential variation of the floating electrode meant here may be, for example, 1 to 3 Volts.

When in this manner a logic one has been written in the first memory transistor, the charge condition of the floating electrode 3 is permanently safeguarded, that is to say so long as a sufficient supply voltage is present. If as a result of loss of charge the second memory transistor passes from the conductive state into the non-conductive state, the input signals for the AND-gate 52 will both be high. As described hereinbefore, the writing process is then started so that the charge condition of the charge storage region is restored. Because the first memory transistor always remains conductive, the output signal at the connection 34, 43 will always maintain the correct value corresponding to the originally written information.

In order to ensure that upon switching the supply voltage the flip-flop comes in the desired stable state, the second control input of the flip-flop is connected to the supply connection 18 via a capacity 81 of, for example, 1 pF.

Proper operation of the circuit described was obtained by means of transistors $T_7$, having a comparatively small channel length measured from source to drain zone and a comparatively large channel width. The width-length ratio of the channels of said transistors $T_7$ was 100/6. The corresponding width-length ratio of the transistors $T_8$ was 8/28. The memory transistors then need only provide comparatively small signal currents, only a small voltage drop occurring across the transistors $T_7$ and the voltage drop across the transistors $T_8$ being comparatively large. The control circuit 70 may be constructed, for example, according to the FIG. 10 diagram.

The control circuit shown in FIG. 10 comprises a start-auxiliary circuit formed by the diode 82 and the n-channel transistors $T_9$ and $T_{10}$. The actual control circuit has two n-channel transistors $T_{11}$ and $T_{12}$ and three p-channel transistors $T_{13}$, $T_{14}$ and $T_{15}$. The transistors $T_{11}$ and $T_{12}$ and $T_{13}$ and $T_{14}$, respectively, are connected in a current mirror configuration. The transistor $T_{13}$ has a comparatively wide channel and the transistor $T_{15}$ has a comparatively long channel.

Known oscillator circuits may be used for the oscillators 68 and 69. For completeness' sake, FIG. 11 shows a cicrcuit diagram of a suitable oscillator. This comprises a p-channel transistor $T_{16}$ and an n-channel transistor $T_{17}$, which together ensure that the capacity 83 is discharged when the input shown on the left in FIG. 11 conveys a high signal. When the input signal is low, the capacity 83 is charged via the resistor 34. The n-channel transistor $T_{18}$ becomes conductive via the inverter 85, the capacity 86 and the inverter 87 and the capacity 83 is again discharged. The transistor $T_{18}$ then becomes non-conductive as a result of which the capacity 83 is again charged.

The output signal of the inverter 87 is applied to an output stage having an n-channel transistor $T_{19}$ and a resistor 88, after which the frequency of the generated oscillator signal is reduced by a factor 2 by the divider 89 which generates a symmetrical output signal.

The resistors 84 and 88 may have values, for example, of apporoximately 500 kOhm and 100 kOhm, respectively. The capacities 83 and 86 have values, for example, of 4 pF and 1 pF, respectively. The signals applied to the voltage multipliers 24 and 20, respectively, may have a frequency of approximately 1 MHz.

The input circuit 77 may consist, for example, of an inverter the output of which is connected to the signal line 73 via a transmission gate controlled by the write signal (connection 78). A circuit as shown in FIG. 12 may also be used. It relates to a series arrangement of two p-channel transistors $T_{20}$ and $T_{21}$ and two n-channel transistors $T_{22}$ and $T_{23}$. The gate electrodes of the outermost transistors $T_{20}$ and $T_{23}$ are connected together via an inverter 90. The remaining two transistors $T_{21}$ and $T_{22}$ constitute an inverter the input of which is connected to the data input 34, 43 and the output of which is connected to the signal line 73. The write signal at the connection 78 determines whether the signal of the connection 34, 43 is transmitted in an inverted from to the signal line 73 or whether said signal path is blocked and the signal at the signal line 73 is determined by the information stored in the first memory transistor.

The inverters 67, 76, 79, 85, 87 and 90, the AND-gate 52, the NOR-gates 80 and the divider 89 in this example are preferably constructed in known manner in CMOS-technology.

The semiconductor device 1 of the second example may comprise several of the memory transistors combinations 66 described, which can each be operated in the manner described. The control electrodes 4 of said transistor combinations may be connected together. Furthermore, the control circuit 70 may be common to two or more transistor combinations. The oscillators 69 may each be replaced, for example, by an OR-gate or a NOR-gate an input of which is connected to the relevant flip-flop and the other input is connected to an oscillator which is common to one or more transistor combinations and which is permanently in operation. One oscillator 69 may also be common to one or more transistor combinations if suitable gate circuits are incorporated between the various flip-flops and said oscillator 69 and between the common oscillator 69 and the various voltage multipliers 20. For example, transmission gates controlled by the output of the relevant flip-flop may be used for this purpose. If the gate circuits connected between the oscillator 69 and the voltage multipliers 20 are moved and are connected between the output of the voltage multipliers and the various injector regions 12, a common voltage multiplier 20 will suffice. In that case the gate circuits in question must be suitable to transmit the high voltage generated by the voltage multiplier to the injector regions 12 or to block said voltage without breakdown of p-n junctions occurring, for example, in the circuit elements of said gate circuits themselves. Method to handle such high voltages are known per se.

The semiconductor devices described in the first and the second example can be manufactured entirely by means of methods known per se. For example, a standard CMOS-manufacturing method may be used for this purpose. For example, an n-type silicon body 8 having a resistivity of approximately 4 Ohm.cm may be used as a starting material. On said body an anti-oxidation mask is provided in the usual manner which does not cover the pattern of the field oxide 45 to be provided. An implantation treatment with phosphorus may then be carried out which ultimately results in the channel interrupting zones 91. A photolacuer mask is then provided which does not cover the active regions which are destined for the n-channel transistors. An implantation treatment with boron ions of sufficient energy is then carried out so that the ions are not masked by the parts of the anti-oxidation mask not covered by the photolacquer mask. Boron may then be implanted with such a low energy that the exposed parts of the anti-oxidation mask do stop said ions. After removing the photolacquer mask the field oxide 45 may be grown. After the oxidation the semiconductor body 8 comprises a number of deep p-type regions, for example the region 63, channel interrupting zones 92 extending in said regions below the field oxide 45 in the usual manner.

After removing the anti-oxidation mask the active regions are provided in the usual manner with a thin insulating layer after which a polycrystalline silicon layer may be provided on the semiconductor body. Said layer may be substantially undoped or may be doped during or after deposition for example, with boron.

The polycrystalline layer is patterned so as to obtain therefrom the gate electrodes of the various transistors and the floating electrode 3. If necessary, conductor tracks for electric connections can also be obtained from said layer. If desired, the parts of the said thin insulating layer not covered by polycrystalline Si may be removed.

A photolacquer mask may then be provided which covers the regions destined for the n-channel transistors. The part 61 (FIG. 5) of the floating electrode 3 and the part 60 in the source zone 5, 46 are also covered by said mask. The dopings for the source and drain zones of the p-channel transistors and for the p-type zones of the memory transistor are then provided in the usual manner.

The regions destined for the p-channel transistors and the memory transistors are now covered with a photolacquer mask, the part 61 of the floating electrode 3 and the part of the surface destined for zone 60, however, being not covered. The doping for the source and drain zones of the n-channel transistors and for the regions 60 and 61 may then be provided.

The dopings provided in the semiconductor material may be diffused and/or activated by means of a suitable thermal treatment.

The insulating layer 44 may be provided by oxidation or, for example, by deposition from the gaseous phase. After contact windows have been opened in the layer 44 a number of them are shown in the figure, a layer of aluminum may be provided. The control electrode 4 may be obtained from said layer. Conductor tracks for electric connection of the circuit elements can also be obtained simultaneously from said layer. The last-mentioned conductor tracks are not shown in the figures to avoid complexity of the drawing. The semiconductor device may then be covered in the usual manner with a protecting insulating layer not shown. The semiconductor devices obtained in this manner can be assembled in the usual manner.

The invention is not restricted to the embodiments described. Many variations are possible without departing from the scope of the invention. For example, the first and second memory transistors may be of the type in which the charge storage region is formed by a non-conductive intermediate layer in a suitable dielectric as is the case inter alia in MNOS-memory transistors. The injector may comprise, for example, a part of the channel region adjoining the semiconductor surface between the source and drain zones and which is separated from the non-conductive intermediate layer by a comparatively thin insulating layer. The fact and the second memory transistors may each have a charge storage region and an injector of their own.

The charge storage region is preferably formed by a conductive intermediate layer, for example, a floating electrode. Said charge storage region may be common to the first and second memory transistors as a result of which inter alia a direct safeguarding of the stored quantity of charge can be obtained which represents the information written in the first memory transistor.

Instead of a spatially separated surface region 12 the injector may also have a surface region united or connected to the source or drain zone of the first and/or the second memory transistor. The injector may also comprise a conductive layer separated from the charge storage region by a thin insulating layer, in which said conductive layer may be provided between the semiconductor surface and the charge storage region or the charge storage region may be present between said conductive layer and the semiconductor surface.

The control electrodes of the first and/or second memory transistor may also be provided between the floating electrode and the semiconductor surface instead of above the floating electrode. The control electrodes may also be formed entirely or partly by semiconductor zones present in the semiconductor body.

The supply of charge to and/or the removal of charge from the charge storage region may be done by means of avalanche breakdown or by means of tunneling. The same type of charge carriers, preferably electrons, may be used in both directions, or one type, for example, electrons, may be used in one direction and the other type of charge carriers, for example, holes, may be used in the other direction. Supplying and removing charge may be done in the same injector or the memory transistors may have an injector for supplying and another injector for removing charge.

In the embodiment in which the first and the second memory transistor are constructed with different threshold voltages, the charge storage region of the first memory transistor preferably comprises a first floating conductive layer 3 and the second memory transistor has a second floating conductive layer 61 which is connected to the first floating conductive layer 3. A first part of the floating conductive layer 3 separated from channel region 9 of the first memory transistor by the insulating layer 10 is of a first material and a second part of the second floating conductive layer 61 separated from a channel region 58 of the second memory transistor by a second insolating layer 62 is of a second material. The first material has a work function differing from that of the second material, the difference in work function determining at least partly the difference between the threshold voltages of the first an the second memory transistor. For example, different materials, for example, polycrystalline silicon and aluminum may be used for the first and the second part. Preferably, however, the same semiconductor material is used for the first and the second part and the difference in work function is obtained by a difference in doping of the first and the second part. In the second embodiment described, the first and the second part are of opposite conductivity types.

Since the first and the second parts are of opposite conductivity types, said parts may be connected together by a conductive connection of a third material, for example, a metal. As described in the second embodiment, the first and the second semiconductor material may also adjoin each other while forming a rectifying junction 93. Such a rectifying junction 93 will often show enough leakage in such manner that the first and second parts will always have substantially the same potential. Moreover, in the second embodiment described the conductivity types of the first and the second part are such that if the potential of the floating conductive layer 3 would change more by loss of charge than the floating conductive layer 61, the p-n junction 93 will be conductive on the forward direction. The potential of the second floating conductive layer 61 will follow that of the first conductive layer 3 and the reliability of the safeguarding is thus not endangered. Also in connection with the desired reliability the injector which is common to the first and the second memory transistor is in this case also coupled to the first floating conductive layer 3 and the second floating conductive layer 61 is constructed to be comparatively small with respect to the conductive layer 3. If in the reverse direction of the rectifying junction 93 such a small leakage current would flow that as result of this a potential difference would be formed between the first and the second floating layer upon writing or due to loss of charge of the second floating conductive layer 61, the second memory transistor will give off the re-write signal at an earlier stage so that written information is maintained at any rate.

A uniform distribution of the potential across the first and the second floating conductive layer is ensured in any case if the rectifying junction 93 is shunted by a conductive connection. The first and the second floating conductive layers 3 and 61 preferably have a common metal-containing top layer, not shown, for example, a readily conducting semiconductor silicide layer. The first semiconductor material is present at least between said top layer and the insulating layer 10 of the first memory transistor and the second semiconductor material is present at least between the top layer and the second insulating layer 62 of the second memory transistor. In this manner the influence of the difference in work function of the first and the second semiconductor material on the threshold voltages is maintained. The common top layer can be obtained in a usual manner, for example, by deposition of a suitable silicide layer on the polycrystalline semiconductor layer or by deposition of a suitable metal layer, if desired succeeded by a thermal treatment in which silicide formation occurs at the interface of the metal layer and the semiconductor layer.

In the embodiments described only the level of the logic one is safeguarded. Generally any charge level which is sensitive to undesired change can be safeguarded by means of a suitable detector in a manner similar to that described. In addition to undesired decrease of the quantity of stored charge, undesired increase of that quantity may also be signalled. In this latter case the semiconductor device is preferably designed so that decreasing the stored quantity of charge can be carried out selectively, only in first memory transistors selected or assigned for this purpose. More than two charge levels per first memory transistor may also represent written information in which each of the charge levels to be considered for this purpose can be safeguarded by means of a suitable detector. It is also possible to safeguard a plurality of levels by means of the same second memory transistor by applying to said memory transistor, for example, periodically different, suitably chosen and fixed bias voltages between control electrode and source zone.

The detection of the completion of the writing process described in the second embodiment by means of a further memory transistor is not restricted to use of a memory transistor with the field oxide as gate dielectric. A suitable threshold voltage for said memory transistor can also be obtained differently or by combination of a number of measures. Furthermore, the detection of the completion of the writing process and the subsequent actual termination of the writing proces can also be used in other semiconductor devices with non-volatile memory transistors, also if the safeguarding of the stored quantity of charge is not anticipated therein. By detection and termination of the writing proces the written charge level is better defined. This form of signalling can also be used to reproducibly write intermediate levels between the uncharged condition and the state with maximum charge. Furthermore, the inverted process, the erasing process, can be limited in in an analogous manner to a reproducible charge level.

The present invention generally provides a reproducible limit of desired charge levels during writing and/or erasing and/or a good safeguarding of written quantities of charge in which correction of the quantity of charge is effected timely when charge is lost. As a result of this, the semiconductor device according to the invention is inter alia less sensitive to variations in the retention time of the non-volatile memory transistors as they may occur inter alia by variations in the manufacturing process, by interference voltages, by the use of comparatively large reading voltages or by temperatures of the semiconductor body which temporarily or not temporarily are comparatively high. Also if the retention time becomes shorter, information once written is well stored so that a reliable operation is obtained. The realized improvement could also be used to slightly reduce the requirements to be improved upon the retention time of the memory transistors. For example, thinner insulating layers can more easily be used than is so far usual in the memory transistor. In that case the high voltages required for writing and erasing could also be reduced. The realized improvement can generally have a favorable effect on the yield of the manufacture of the semiconductor devices.

The conductivity types indicated in the examples can be interchanged, the indicated voltages being adapted correspondingly. Instead of silicon, for example, germanium or an $A_{111}$-$B_V$ compound may also be used as a semiconductor material. Silicon oxide may be used for the various insulating layers. Silicon nitride or aluminum oxide may also be used or oxinitride layers may be used. The oxide layer 45 serving as field insulation can be obtained by means of conventional methods other than local oxidation.

Both in the circuit arrangement shown in FIG. 1 and in the circuit arrangement shown in FIG. 9 means are present to keep the potential differences which occur at the memory transistors during reading the charge condition small. These means are of particular importance in the case in which the relevant memory transistor is non-conductive. If the memory transistor is conductive and if the on-resistance of said transistor is small enough, the potential of the drain zone is substantially equal to that of the source zone. If on the contrary the memory transistor is non-conductive, the potential of the drain zone could become substantially equal to the negative supply voltage of the line 25. Since the charge storage region in this state is not charged, negative charge could flow from the drain zone to the floating conductive layer. In order to prevent this, the potential difference in the circuit shown in FIG. 1 between the source and drain zones of the memory transistors is limited to at most a threshold voltage, while in the circuit arrangement shown in FIG. 9 said potential difference is substantially zero due to the transistors $T_7$ and the driving thereof with the control circuit 70. In fact these means produce a protection of the logic zero level, a protection of the erased, the discharged, state of the charge storage region.

If desirable, the operation of the FIG. 9 circuit can be improved by providing a suitable hysteresis at the node of the transistor $T_7$ connected to the connection 48 and the inverter 79. For that purpose, for example, a suitable Schmitt-trigger may be incorporated in the line 74 preceding the inverter 79.

What is claimed is:

1. A semiconductor device comprising a semiconductor body having a surface-adjacent layer, a charge storage region, and at least one non-volatile memory cell which comprises a first non-volatile memory transistor, said first memory transistor comprising a control electrode capacitively coupled to said charge storage region and source and drain zones of a first conductivity type in said surface-adjacent layer, the surface-adjacent layer being of a second conductivity type opposite to the first, a channel region of the first memory transistor located between the source and drain zones and covered with an insulating layer which separates the charge storage region from the channel region, an injector region in said surface-adjacent layer, a thin insulating layer separating said charge storage region from said injector region, charge transport occurring in operation through said thin insulating layer by applying a suitable electric field to vary the quantity of charge stored in the charge storage region, characterized in that the semiconductor body further comprises a detector which has a second non-volatile memory transistor, the output signal of which, with a previously-determined quantity of charge stored in the charge storage region of said first memory transistor, forms a reference value, and means for reading the output signal of the second memory transistor for comparing said output signal of the second memory transistor with the output signal of the first memory transistor and for correcting the quantity of stored charge in both memory transistors when the reference value is exceeded.

2. A semiconductor device as claimed in claim 1, characterized in that the first and the second memory transistor have a common charge storage region.

3. A semiconductor device as claimed in claim 1 or 2, characterized in that the second memory transistor has a control electrode which is connected to that of the first memory transistor.

4. A semiconductor device as claimed in claim 1 or 2, comprising a plurality of memory cells, wherein said memory cells each have a further memory transistor.

5. A semiconductor device as claimed in claim 1 or 2, characterized in that the injector is common to the first and the second memory transistor.

6. A semiconductor device as claimed in claim 1 or 2, characterized in that the source zone is common to the first and the second memory transistors.

7. A semiconductor device as claimed in claim 1 or 2, characterized in that the reference value is obtained by means of a difference in the bias voltage between the control electrode and the source zone of the first memory transistor and the bias voltage between the control electrode and the source zone of the second transsitor, said difference being substantially fixed within the device.

8. A semiconductor device as claimed in claim 1 or 2, further comprising a further non-volatile memory transistor, an output of which indicates that, by charge transport between the injector and the charge storage region of the first non-volatile memory transistor, a predetermined charge level in said charge storage region is reached, and means for terminating said charge transport by means of said output signal.

9. A semiconductor device as claimed in claim 1 or 2, characterized in that the detector is common to a plurality of non-volatile memory cells.

10. A semiconductor device as claimed in claim 9, characterized in that the detector further comprises third and fourth memory transistors and the output signal of the third and fourth memory transistors of the detector can be compared with each other.

11. A semiconductor device as claimed in claim 1 or 2, characterized in that the first and the second memory transistor have different threshold voltages.

12. A semiconductor device as claimed in claim 11, characterized in that the charge storage region of the first memory transistor comprises a first floating conductive layer and the second memory transistor has a second floating conductive layer which is connected to the first floating conductive layer, with a first part of the first floating conductive layer being separated from the channel region of the first memory transistor by the insulating layer, said first part being of a first material, with a second part of the second floating conductive layer being separated from a channel region of the second memory transistor by a second insulating layer, said second part being of a second material, and with the first material having a work function differing from that of the second material, the difference in work function determining at least partly the difference between the threshold voltages of the first and the second memory transistors.

13. A semiconductor device as claimed in claim 12, characterized in that the first material is a semiconductor material of a given conductivity type and the second material is a semiconductor material of the opposite conductivity type.

14. A semiconductor device as claimed in claim 13, characterized in that the given conductivity type is the first conductivity type.

15. A semiconductor device as claimed in claim 13, characterized in that the first and the second semiconductor material adjoin each other and form a rectifying junction, and the first and the second floating conductive layers have a common metal-containing top layer, the first semiconductor material extending at least between the top layer and the insulating layer of the first memory transistor and the second semiconductor material extending at least between the top layer and the second insulating layer of the second memory transistor.

* * * * *